United States Patent
Wang

(10) Patent No.: US 7,498,921 B1
(45) Date of Patent: Mar. 3, 2009

(54) TRANSFORMER AND TRANSFORMER ASSEMBLY

(75) Inventor: Jin-Biau Wang, Taipei Hsien (TW)

(73) Assignee: Acbel Polytech Inc. (TW)

( * ) Notice: Subject to any disclaimer, the term of this patent is extended or adjusted under 35 U.S.C. 154(b) by 0 days.

(21) Appl. No.: 11/984,572

(22) Filed: Nov. 20, 2007

(30) Foreign Application Priority Data

Oct. 5, 2007 (TW) ............................. 96137374 A

(51) Int. Cl.
*H01F 5/00* (2006.01)
(52) U.S. Cl. ...................................... 336/200
(58) Field of Classification Search ................... 336/65, 336/83, 192, 198, 200, 225, 232
See application file for complete search history.

(56) References Cited

U.S. PATENT DOCUMENTS 6,927,663 B2 *  8/2005  Iverson et al. ............... 336/200
7,091,817 B2 *  8/2006  Peck et al. ................... 336/208
7,295,095 B2 * 11/2007  Suzui .......................... 336/200
2004/0183642 A1 *  9/2004  Suzui .......................... 336/192

* cited by examiner

*Primary Examiner*—Tuyen T. Nguyen
(74) *Attorney, Agent, or Firm*—Hershkovitz & Associates, LLC; Abe Hershkovitz

(57) ABSTRACT

A transformer is to be electrically connected to a circuit board. The transformer has a bobbin, a copper sheet assembly and a coil assembly. The bobbin has two side plates and a winding core on which a primary winding, a secondary winding and a magnetic core assembly are mounted. The copper sheet assembly as the primary or the secondary winding has multiple copper sheets. Each copper sheet is an inverted U-shape with two legs, and is mounted on a groove defined on the winding core. Engaging structures formed on the copper sheets and the grooves steadily hold the copper sheet assembly on the winding core to prevent the copper sheets from shifting to incorrect positions. A conducting board below the bobbin connects the copper sheets in sequence. Since the loops formed by the copper sheets and the electrical connector are more nearly concentric, leakage inductance of the transformer will reduce.

16 Claims, 8 Drawing Sheets

TRANSFORMER AND TRANSFORMER ASSEMBLY

BACKGROUND OF THE INVENTION

1. Field of the Invention

The present invention relates to a transformer and more particularly to a transformer and a transformer assembly that use copper sheets as a primary winding or a secondary winding and is capable of reducing leakage inductance.

2. Description of the Related Art

A transformer is an electromagnetic device that has a primary winding and a secondary winding to convert electrical energy, transfer electrical energy from one circuit to another circuit and is often mounted on a circuit board. Each winding of most conventional transformers has a wire wound in loops. With reference to FIGS. 7 and 8, another conventional transformer substitutes multiple copper sheets for the wire in the primary winding or the secondary winding and has a bobbin (70), multiple copper sheets (80), a coil assembly and a magnetic core (72).

The bobbin (70) is mounted on a circuit board (90) and comprises two side plates and a hollow winding core (71) mounted between the two side plates. The circuit board (90) has multiple printed circuit lines.

Each of the copper sheets (80) is a U-shaped plate with an inner edge and two ends. When each of the copper sheets (80) is mounted on the winding core (71) the inner edge abuts the surface of the winding core (71). The two ends of each copper sheet (80) are connected to the printed circuit lines on the circuit board (90) to form multiple loops in an electrical path through the copper sheets (80).

The coil assembly is wound around the winding core (71) and has two ends being connected to the printed circuit board (90). The magnetic core (72) is mounted through and around the bobbin (70), wherein the broken lines shown on FIG. 8 is for the purpose of indicating an approximate position where the magnetic core is mounted.

However, the transformer constructed by the copper sheets still has some drawbacks.

1. Even though the copper sheets (80) are used to replace the wire in either the primary winding or the secondary winding, a wire wound in loops as the secondary winding or the primary winding is required. However, the transformer does not provide any engaging or positioning means for steadily holding the copper sheet (80) on the winding core (71). When the wire is wound around the winding core (71), some of the copper sheets (80) may be easily moved, which results in the ends of the copper sheets (80) moving. Since the ends of the copper sheets (80) are shifted, soldering the ends of the copper sheets (80) to the printed circuit lines on the printed circuit board (90) will be more difficult.

2. Since the copper sheets (80) are electrically and sequentially connected by printed circuit lines of the circuit board (90), a current (I) flowing from one end of the copper sheet (80) to other copper sheets (80) has to pass through the printed circuit lines. A large gap exists between the winding core (71) and the circuit board (90), the air of the gap results in an imperfect coupling. Due to the imperfect coupling, a high leakage inductance will occur and reduce energy transfer efficiency of the transformer.

To overcome the shortcomings, the present invention provides a transformer to mitigate or obviate the aforementioned problems.

SUMMARY OF THE INVENTION

The main objective of the invention is to provide a transformer having copper sheets as a primary winding or a secondary winding and reducing leakage inductance between the primary and secondary windings.

The transformer comprises a bobbin, a copper sheet assembly and a coil assembly. The bobbin comprises two side plates and a winding core on which a primary winding, a secondary winding and a magnetic core assembly are mounted. The copper sheet assembly used as either the primary or the secondary winding comprises multiple copper sheets and a conducting board. Each copper sheet is an inverted U-shape with two legs, and is mounted on a groove defined on the winding core.

Engaging structures are formed on the copper sheets and the grooves steadily to hold the copper sheet assembly on the winding core so as to prevent the copper sheets from shifting to incorrect positions. The conducting board is mounted below the bobbin and connects the copper sheets in sequence.

When the transformed are assembled and mounted on the circuit board, a current can flow through the copper sheets by the conducting board, without going through the circuit board. Since the conducting board is very adjacent to the bobbin, the loops formed by the copper sheets and the electrical connector are more nearly concentric, leakage inductance of the transformer will reduce.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
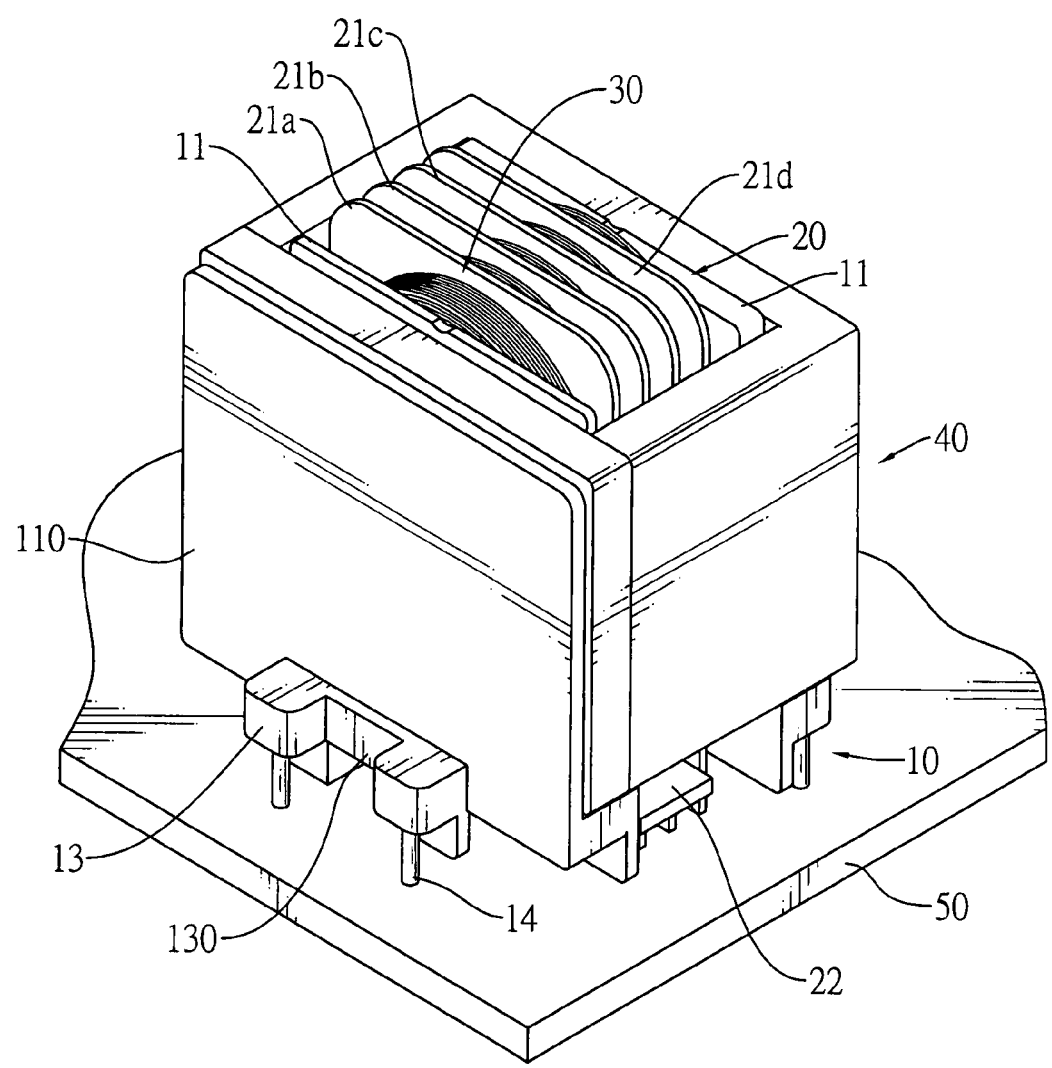
FIG. 1 is a perspective view of a transformer assembly in accordance with the present invention.
Figure 2:
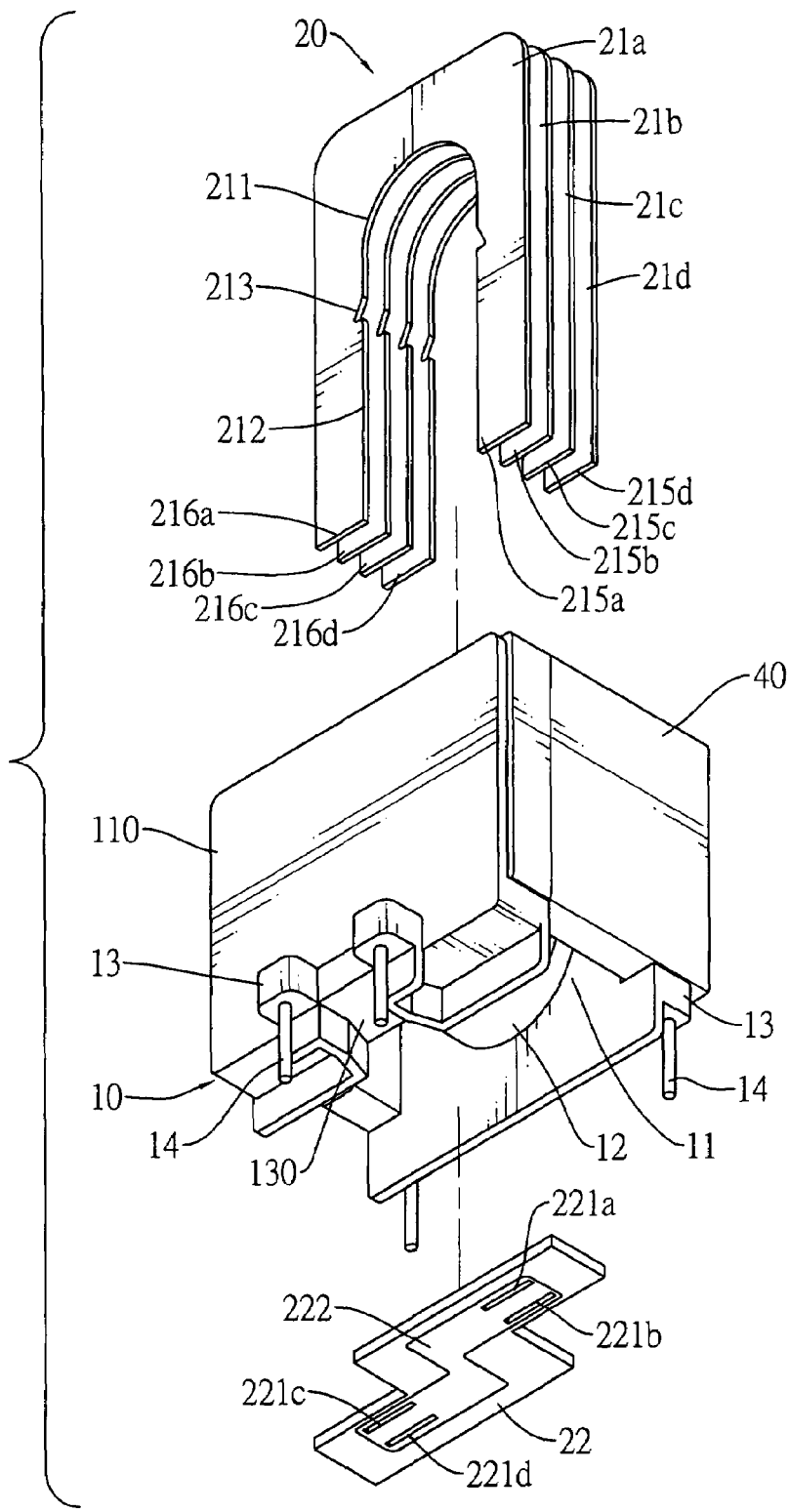
FIG. 2 is an exploded perspective view of a first embodiment of a transformer in accordance with the present invention.

With reference to FIGS. 1 and 2, a transformer in accordance with the present invention comprises a bobbin (10), a copper sheet assembly (20), a coil assembly (30) and a magnetic core assembly (40). The transformer can be electrically connected on an electrical device such as a circuit board (50).

The copper sheet assembly (20) of the transformer can be used as a primary winding or a secondary winding, while the coil assembly (30) is correspondingly used as a secondary winding or a primary winding. The transformer in accordance with the present invention can be applied to a step-up transformer or a step-down transformer.

Figure 3:
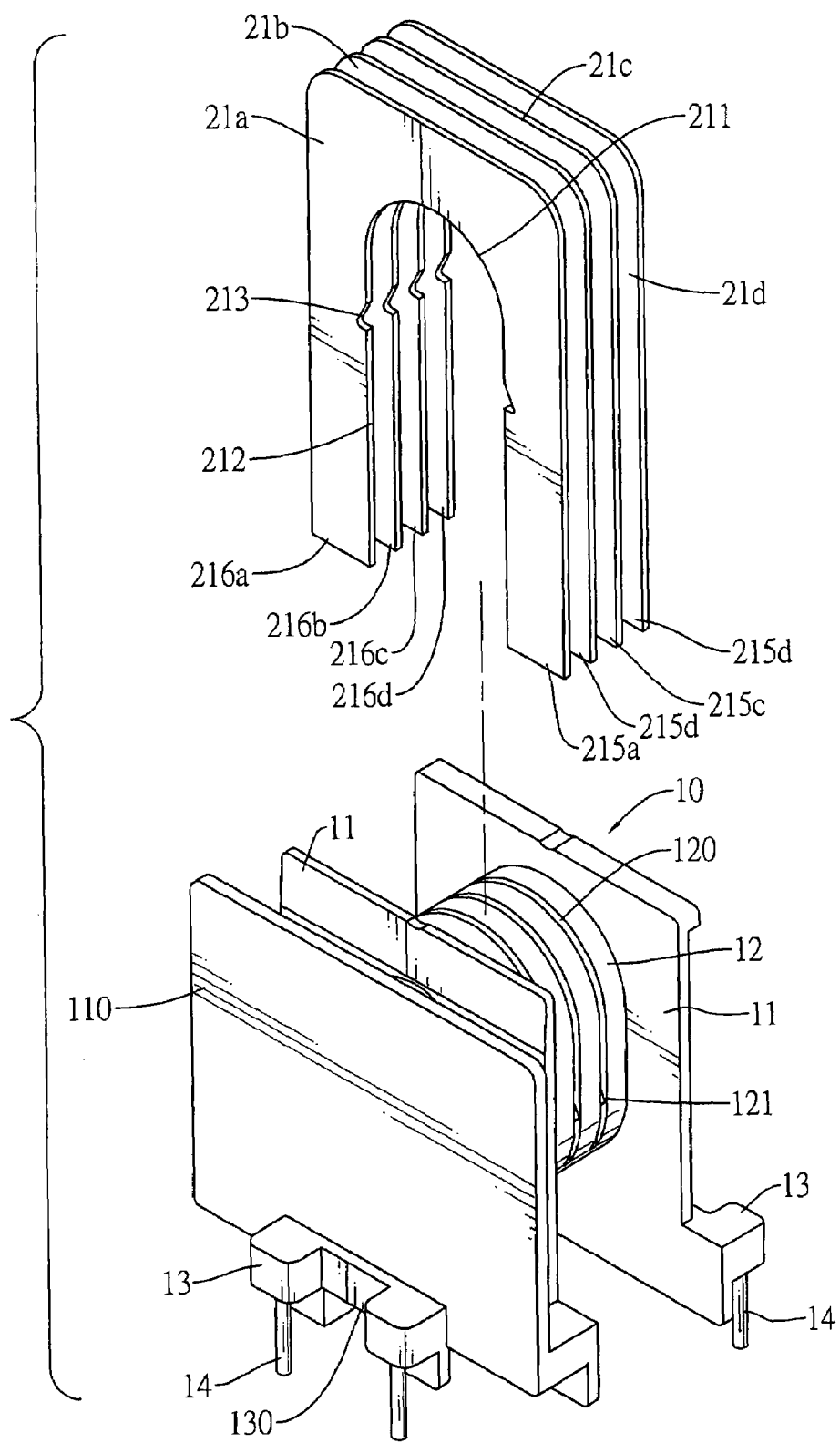
FIG. 3 is another exploded perspective view of the transformer in FIG. 2.

With reference to FIGS. 1 and 3, the bobbin (10) comprises two side plates (11) with lower edges, a hollow winding core (12), two terminal seats (13) and multiple pins (14). The side plates (11) face and align with each other and the hollow winding core (12) is connected between the side plates (11). The two terminal seats (13) respectively protrude from outer surfaces of the side plates (11) and are adjacent to lower edges of the side plates (11). The pins (14) extend perpendicularly from the terminal seats (13) for electrically connecting to a electronic device such as a circuit board (50). Further, the winding wire of the coil assembly (30) can be wound on these pins (14). In this embodiment, an outer plate (110) is further connected to the lower edge of one of the side plates (11) and separates from the side plate (11) by a small distance, and the terminal seat (13) is formed on a lower edge of the outer plate (110). At least one of the terminal seat (13) is further defined with a wire gap (130) through which the winding wire of the coil assembly (30) can be easily drawn outward from the winding core (12) and wound around the pins (14). Since the winding wire extends through the wire gap (130), the problem of the winding wire directly projecting from the bottom surface of the bobbin (10) is avoided.

In this embodiment, the wining core (12) is elliptic in cross-section and has an outer surface on which multiple grooves (120) are defined. The grooves (120) may be annular, U-shaped or other shapes. Each of the grooves (120) of this embodiment is a U-shaped groove that extends from one lateral surface, across the top surface, to the opposite lateral surface of the winding core (12). Furthermore, at least one protrusion (121) is formed in the lateral surface of each groove (120). In this embodiment, two protrusions (121) are respectively formed in the opposite lateral surfaces of each groove (120). The copper sheet assembly (20) is steadily mounted in the grooves (120). The protrusions (121) reinforces the engagement between the copper sheet assembly (20) and the winding core (12).

Figure 4:
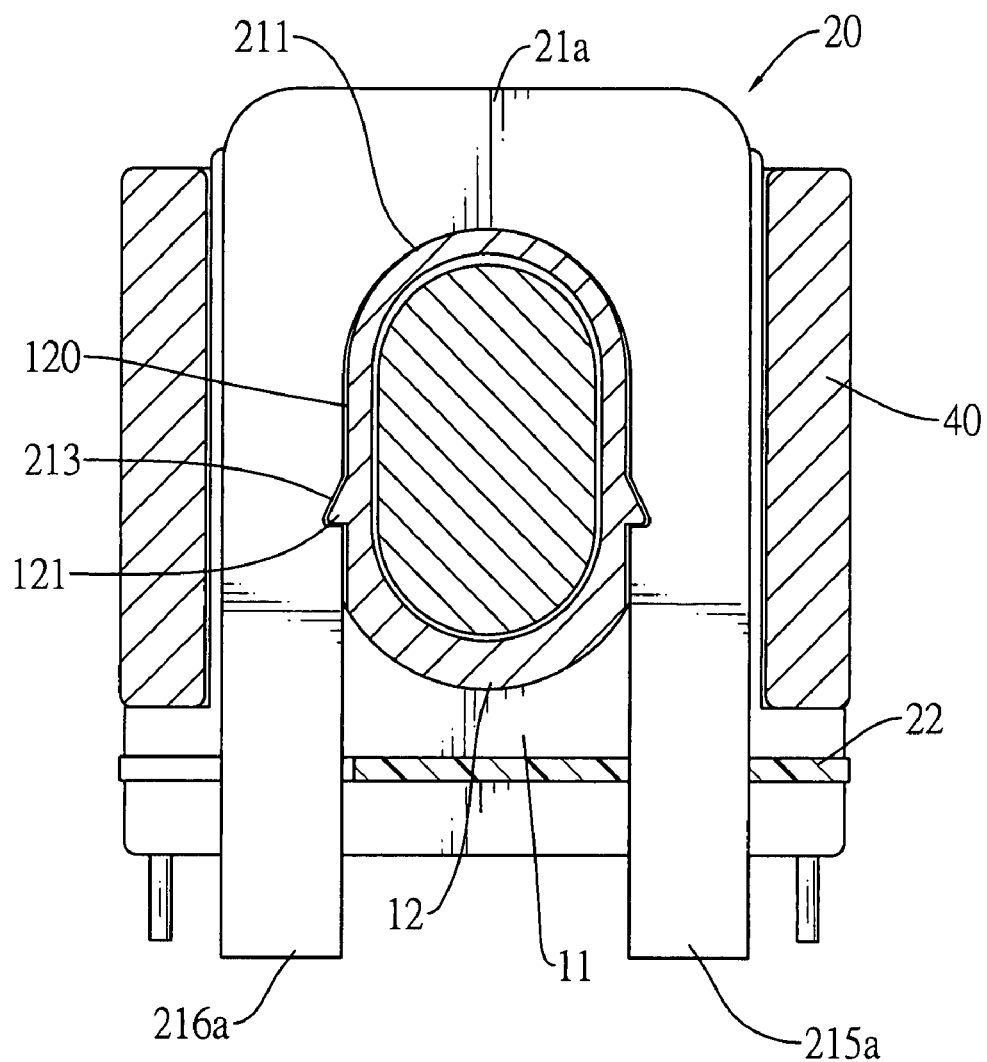
FIG. 4 is a side view in partial section of the transformer in FIG. 2.

With reference to FIGS. 2 to 4, the copper sheet assembly (20) comprises multiple copper sheets (21a)-(21d) and a conducting board (22). Each of the copper sheets (21a)-(21d) can be produced to have a desired outline such as rectangular or U-shaped with an inner edge corresponding to the winding core (12). Taking one copper sheet (21a) as an example, the inner edge consists of a top curved edge (211) and two lower perpendicular edges (212) extending from opposite ends of the curved edge (211). Therefore, the inner edge of the copper sheet (21a) corresponds to the cross-section of the winding core (12) and can be mounted in the groove (120) in part.

For example, with the top curved edge (211) and/or at least one perpendicular edge (212) of the inner edge, the copper sheet (21) can be held in the groove (120). In this embodiment, the top curved edge (211) and the two perpendicular edges (212) of each copper sheet (21a)-(21d) are mounted in the groove (120). Preferably, each copper sheet (21a)-(21d) has a thickness accommodated to a width of each groove (120) so that the copper sheets (21a)-(21d) can be steadily mounted on the winding core (12) when the inner edges of the copper sheets (21a)-(21d) are held in the grooves (120).

To reinforce the engagement between the winding core (12) and the copper sheets (21a)-(21d), engaging structures can be provided on the grooves (120) and the copper sheets (21a)-(21d). As discussed above, the protrusions (121) are respectively formed in the opposite lateral surfaces of each groove (120). Therefore, each copper sheet (21a)-(21d) forms two notches (213) respectively on the perpendicular edges (212) accommodated to the protrusions (121) so as to prevent the copper sheets (21a)-(21d) from separating from the winding core (12). Further, each copper sheet (21a)-(21d) has a first leg with a first distal end (215a)-(215d) and a second leg with a second distal end (216a)-(216d).

As shown in FIG. 2, with regard to the conducting board (22) of the copper sheet assembly (20), the conducting board (22) in this embodiment is a printed circuit board (PCB). The PCB comprises a substrate with a top surface and bottom surface, a conductive layer (222) formed on either the top or the bottom surface of the substrate, and multiple through holes (221a)-(221d) or contact pads that electrical connect with the conductive layer (222). The conductive layer (222) can be formed by copper foil or other conductive material. If the contact pads are formed on the conducting board (22), the distal ends of the copper sheets can be directly on the conducting board (22) through the so-called surface mounting technology (SMT). Further, the legs to be connected on the contact pads of the copper sheets are modified to have a proper length.

The conducting board (22) is to be interposed between the winding core (12) and the circuit board (50), and at least two copper sheets are electrically connected to the through holes (221a)-(221d) or the contact pads. The conducting board (22) of this embodiment has four through holes (221a)-(221d), and a part of the distal ends (215a)-(215d) (216a)-(216d) of the copper sheets (21a)-(21d) are correspondingly insert through these holes (221a)-(221d) and then be welded on the conducting board (22). The rest of the distal ends of the copper sheets can be directly connected on the circuit board (50).

In more detail, the two first distal ends (215a)(215b) of the two copper sheets (21a, 21b) are connected to the two through holes (221a)(221b), and the two second ends (216c)(216d) of the other two copper sheets (21c)(21d) are connected to the other two through holes (221c)(221d). In other words, this embodiment used two copper sheets (21a,21b) (21c,21d) as a copper-sheet unit and the at least two copper-sheet units are sequentially connected by the conducting board (22).

Figure 5:
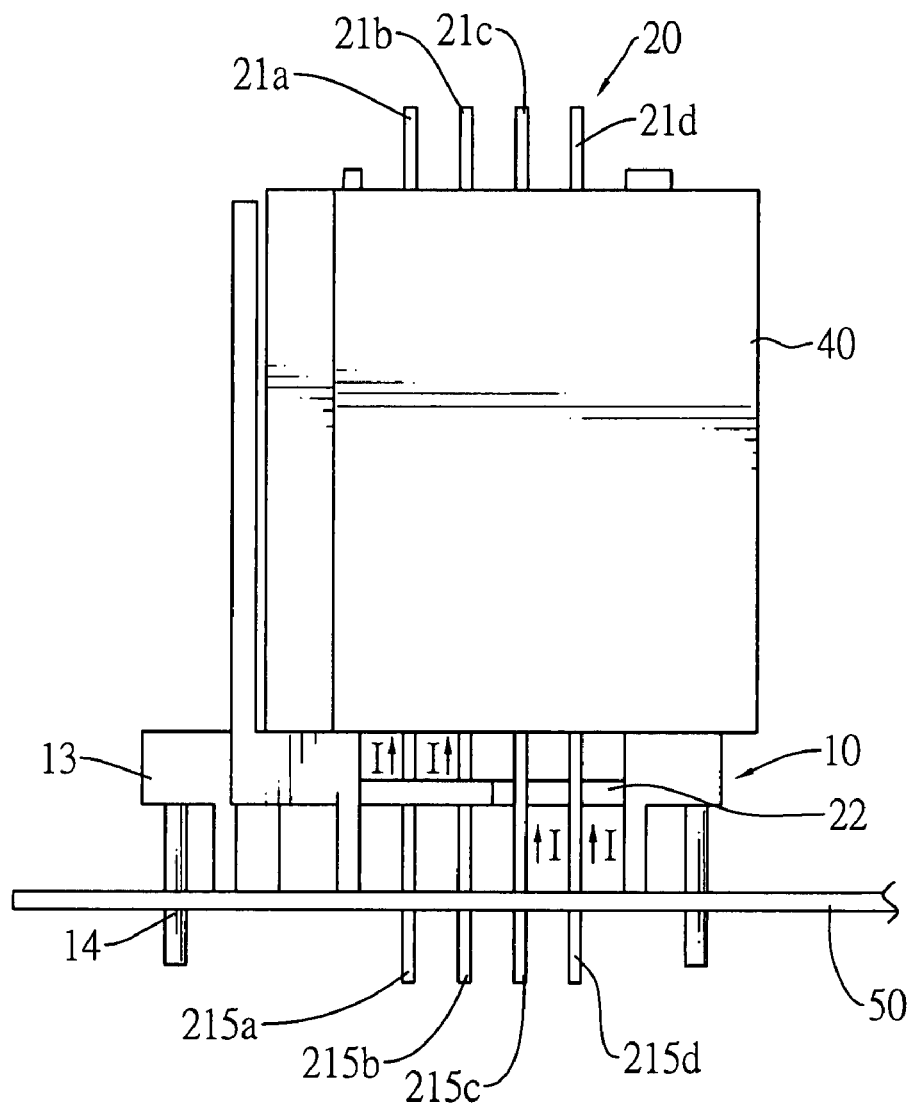
FIG. 5 is a side view of the transformer assembly in FIG. 1.

With reference to FIGS. 1, 2 and 5, the transformer of the present invention is connected on the circuit board (50). As an example, when a current (I) coming from the circuit board (50) flows to the first distal ends (215c)(215d) of the two copper sheets (21c)(21d), the current (I) sequentially passes through the second distal ends (216c)(216d), the conductive layer (222) of the conducting board (22), the first ends (215a)(215b) of the other two copper sheets (21a)(21b), and eventually flows to the circuit board (50) through the two first ends (216a)(216b). An important feature should be noticed is that the current (I), when passing through the copper sheets (21a)-(21d), does not goes through the circuit board (50).

In comparison to the conventional approach that the current from one copper sheet flowing to another copper sheet must be conducted by the circuit board to which the transformer is mounted, the present invention provides a conducing board (22) as a current conducting element so that the current (I) does not have to go through the circuit board (50). Since the conducting board (22) is interposed between the winding core (12) and the distal ends (215a)-(215d)(216a)-(216d) of the copper sheets and is very adjacent to the magnetic core assembly (40), the gap between the conducting board (22) and the magnetic core assembly (40) is much smaller than the gap between the circuit board (50) and the magnetic core assembly (40). Accordingly, the magnetic flux of the transformer can be effectively concentrated within the magnetic core assembly (40), which results in significant reduction of leakage inductance and improvement of the energy transfer efficiency over conventional transformers.

The magnetic core assembly (40) can be EI type or EE type. In this embodiment, the magnetic core assembly (40) is EI type.

Figure 6:
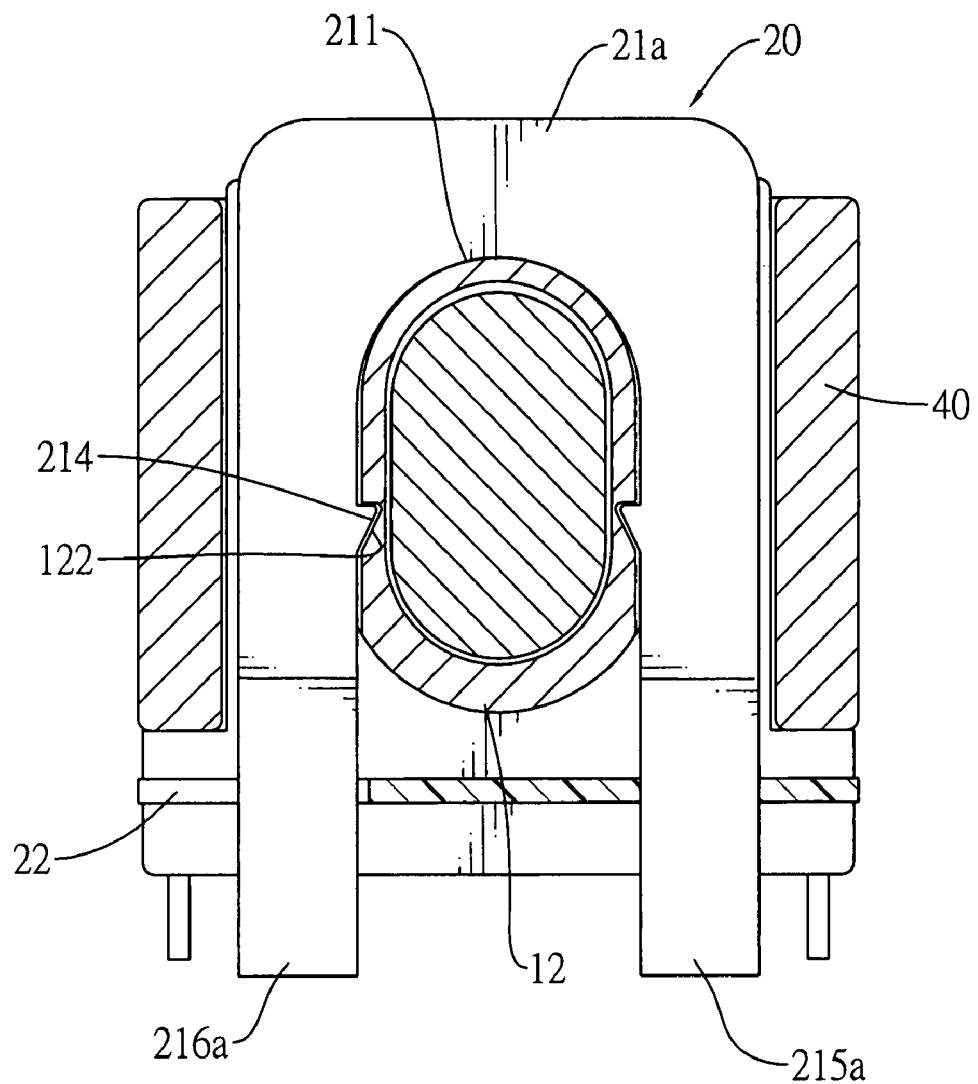
FIG. 6 is a side view in partial section of a second embodiment of a transformer in accordance with the present invention.
Figure 7:
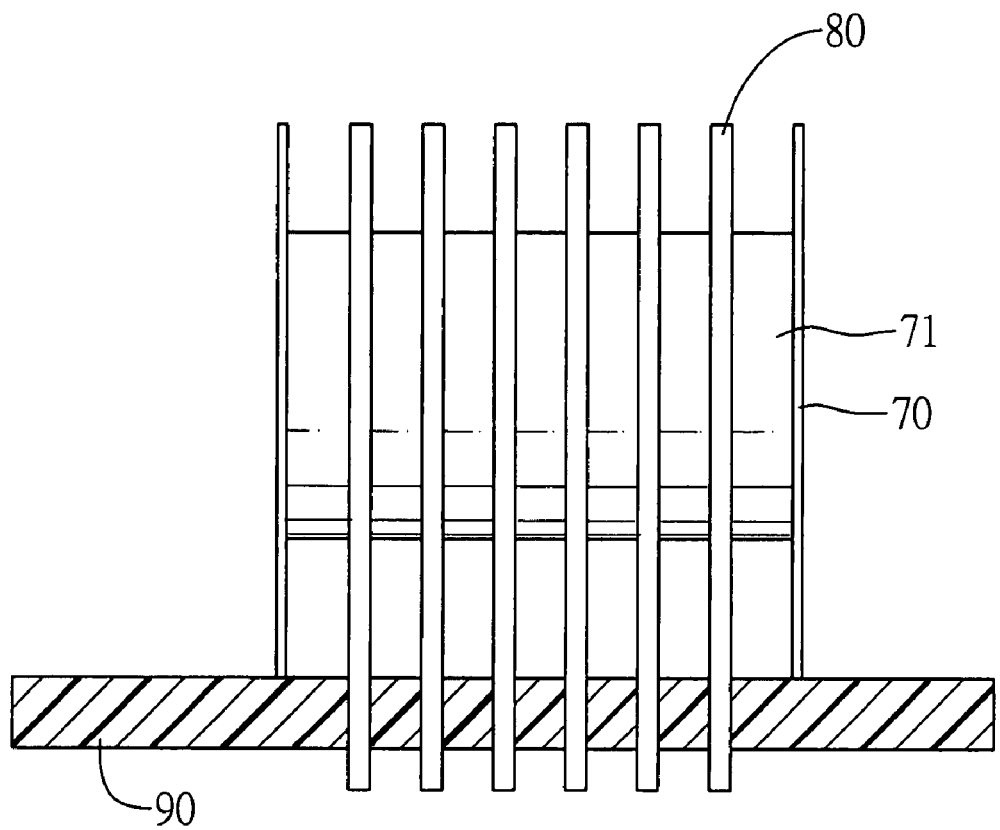
FIG. 7 is a side view in partial section of a bobbin of a conventional transformer in accordance with the prior art mounted on a circuit board.
Figure 8:
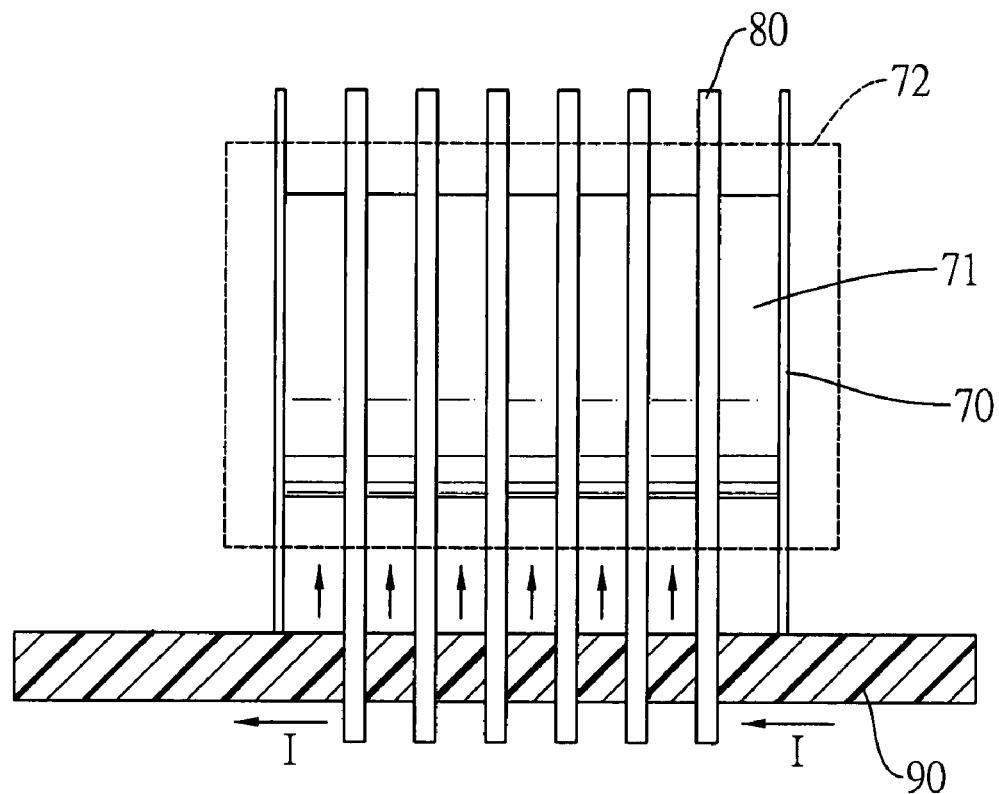
FIG. 8 is a conventional transformer in accordance with the prior art with the bobbin in FIG. 7.

With reference to FIG. 6, another preferred embodiment of the present invention is substantially similar to the first embodiment as described above, except for the engaging structures provided on the grooves (120) and the copper sheets (21a)-(21d).

In this embodiment, protrusions (214) are formed on the perpendicular edge (212) of the inner edge of each copper sheet (21a)-(21d) and notches (122) are formed in the grooves (120) to correspond to the protrusions (214). Comparing with the first embodiment, even though the protrusions (214) and the notches (122) are interchanged from the copper sheets (21a)-(21d) and the winding core (12), the coppers sheets are still steadily attached on the winding core (12). Furthermore, the protrusions and the notches can be shaped to any form like a sharp teeth or a hemispherical ball to achieve the engagement between the copper sheet assembly (20) and the winding core (12).

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A transformer comprising:
   a bobbin having two side plates and a hollow winding core connected between the two side plates;
   a copper sheet assembly comprising
      multiple copper sheets mounted on the winding core of the bobbin, wherein each of the copper sheets has two legs and each leg has a distal end; and
      a conducting board electrically connected to at least two of the copper sheets and being interposed between the winding core and the distal ends of the copper sheets;
   a coil assembly comprising at least one winding wire being wound around the winding core between two adjacent copper sheets; and
   a magnetic core assembly mounted on the bobbin.

2. The transformer as claimed in claim 1, wherein the conducting board is a printed circuit board (PCB) comprising a substrate, multiple through holes defined through the substrate, and a conductive layer formed on the substrate among the through holes to electrically connect the through holes.

3. The transformer as claimed in claim 2, wherein the winding core has a surface and further comprises multiple grooves defined on the surface;
   each of the copper sheets has an inner edge being received in part in the groove of the winding core; and
   engaging structures are provided in the grooves and the copper sheets to reinforce engagement between the winding core and the copper sheet assembly.

4. The transformer as claimed in claim 3, wherein the winding core is an elliptic tube having a top surface and two opposite lateral surfaces, and each groove of the winding core extends from one lateral surface, across the top surface, to the other lateral surface; and
   the inner edge of each copper sheet accommodates to a cross-section of the winding core and has a top curved edge and two perpendicular edges extending from opposite ends of the curved edge.

5. The transformer as claimed in claim 4, further comprising:
   two terminal seats respectively protruding from outer surface of the two side plates and being adjacent to lower edges of the two side plates;
   multiple pins extending from the terminal seats;
   a wire gap defined on at least one the terminal seats to allow the winding wire of the coil assembly being drawn outward from the winding core and wound on the pins.

6. The transformer as claimed in claim 4, wherein the engaging structures comprise:
   at least one protrusion formed in each groove of the winding core; and
   a notch formed on each copper sheet to correspond to the protrusion.

7. The transformer as claimed in claim 4, wherein the engaging structures comprise:
   at least notch formed in each groove of the winding core; and
   a protrusion formed on each copper sheet to correspond to the protrusion.

8. The transformer as claimed in claim 1, wherein the copper sheet assembly is a primary winding and the coil assembly is a secondary winding.

9. The transformer as claimed in claim 1, wherein the copper sheet assembly is a secondary winding and the coil assembly is a primary winding.

10. A transformer assembly comprising a transformer being electrically connected to a circuit board, the transformer comprising:
    a bobbin having two side plates and a hollow winding core connected between the two side plates;
    a copper sheet assembly comprising
       multiple copper sheets mounted on the winding core of the bobbin, wherein each of the copper sheets has two legs and each leg has a distal end; and
       a conducting board electrically connected to at least two of the copper sheets and being interposed between the winding core and the circuit board;
    a coil assembly comprising at least one winding wire being wound around the winding core between two adjacent copper sheets; and
    a magnetic core assembly mounted on the bobbin.

11. The transformer assembly as claimed in claim 10, wherein the conducting board is a printed circuit board (PCB) comprising a substrate, multiple through holes defined through the substrate, and a conductive layer formed on the substrate among the through holes to electrically connect the through holes.

12. The transformer assembly as claimed in claim 11, wherein the winding core has a surface and further comprises multiple grooves defined on the surface;
    each of the copper sheets has an inner edge being received in part in the groove of the winding core; and
    engaging structures are provided in the grooves and the copper sheets to reinforce engagement between the winding core and the copper sheet assembly.

13. The transformer assembly as claimed in claim 12, wherein the winding core is an elliptic tube having a top surface and two opposite lateral surfaces, and each groove of the winding core extends from one lateral surface, across the top surface, to the other lateral surface; and
    the inner edge of each copper sheet accommodates to a cross-section of the winding core and has a top curved edge and two perpendicular edges extending from opposite ends of the curved edge.

14. The transformer assembly as claimed in claim 13, further comprising:
   two terminal seats respectively protruding from outer surface of the two side plates and being adjacent to lower edges of the two side plates;
   multiple pins extending from the terminal seats;
   a wire gap defined on at least one of the terminal seats to allow the winding wire of the coil assembly being drawn outward from the winding core and wound on the pins.

15. The transformer assembly as claimed in claim 13, wherein the engaging structures comprise:
   at least one protrusion formed in each groove of the winding core; and
   a notch formed on each copper sheet to correspond to the protrusion.

16. The transformer assembly as claimed in claim 13, wherein the engaging structures comprise:
   at least notch formed in each groove of the winding core; and
   a protrusion formed on each copper sheet to correspond to the protrusion.

* * * * *